(12) United States Patent
Jung et al.

(10) Patent No.: US 8,394,243 B1
(45) Date of Patent: Mar. 12, 2013

(54) SPUTTERED COBALT OXIDE FOR PERPENDICULAR MAGNETIC RECORDING MEDIUM WITH LOW MEDIA NOISE

(75) Inventors: Hong-Sik Jung, Pleasanton, CA (US); Donald Stafford, San Jose, CA (US); B. Ramamurthy Acharya, Fremont, CA (US); Sudhir S. Malhotra, Fremont, CA (US); Gerardo A. Bertero, Redwood City, CA (US)

(73) Assignee: WD Media, Inc., San Jose, CA (US)

( * ) Notice: Subject to any disclaimer, the term of this patent is extended or adjusted under 35 U.S.C. 154(b) by 653 days.

(21) Appl. No.: 12/242,410

(22) Filed: Sep. 30, 2008

Related U.S. Application Data

(60) Provisional application No. 61/083,506, filed on Jul. 24, 2008.

(51) Int. Cl.
*C23C 14/00* (2006.01)
*G11B 5/33* (2006.01)

(52) U.S. Cl. ........... 204/192.11; 204/192.1; 204/298.04; 428/812

(58) Field of Classification Search ............... 204/192.1, 204/192.2; 428/812
See application file for complete search history.

(56) References Cited

U.S. PATENT DOCUMENTS

| | | | |
|---|---|---|---|
| 5,034,286 A | 7/1991 | Nasu et al. | |
| 5,326,637 A | 7/1994 | Nasu et al. | |
| 5,392,290 A | 2/1995 | Brown et al. | |
| 5,820,963 A | 10/1998 | Lu et al. | |
| 5,840,394 A | 11/1998 | Ranjan et al. | |
| 6,406,600 B1 | 6/2002 | Takashima | |
| 6,410,133 B1 | 6/2002 | Kirino et al. | |
| 6,472,047 B1 | 10/2002 | Kirino et al. | |
| 6,495,252 B1 | 12/2002 | Richter et al. | |
| 6,534,206 B1 | 3/2003 | Kirino et al. | |
| 6,602,620 B1 | 8/2003 | Kikitsu et al. | |
| 6,730,421 B1 | 5/2004 | Kirino et al. | |
| 6,749,955 B2 | 6/2004 | Kirino et al. | |
| 6,797,137 B2 | 9/2004 | Sandlin et al. | |
| 6,811,890 B1 | 11/2004 | Zhou et al. | |
| 6,866,948 B2 | 3/2005 | Koda et al. | |
| 6,881,503 B2 | 4/2005 | Lu et al. | |
| 7,033,686 B2 | 4/2006 | Hirayama et al. | |
| 7,141,316 B2 | 11/2006 | Iwasaki et al. | |
| 7,226,674 B2 | 6/2007 | Koda et al. | |
| 7,229,588 B2 | 6/2007 | Sandlin et al. | |
| RE40,100 E | 2/2008 | Zhang | |
| 7,482,071 B2 * | 1/2009 | Do et al. ................ | 428/836.2 |
| 2002/0110707 A1 | 8/2002 | Kirino et al. | |
| 2003/0054202 A1 | 3/2003 | Arisaka et al. | |
| 2003/0134154 A1 | 7/2003 | Kirino et al. | |
| 2004/0166376 A1 | 8/2004 | Kirino et al. | |

(Continued)

FOREIGN PATENT DOCUMENTS

JP 2005353256 A 12/2005
WO 2009044794 4/2009

OTHER PUBLICATIONS

J. Ariake et al., "Co—Pt—iO2 Composite Film for Perpendicular Magnetic Recording Medium", IEEE Transactions on Magnetics, vol. 41, No. 10, pp. 3142-3144, Oct. 2005.

(Continued)

*Primary Examiner* — Stephen Rosasco

(57) ABSTRACT

Method of incorporating atomic oxygen into a magnetic recording layer by sputtering a target containing an oxide of cobalt. The oxide of cobalt may be sputtered to provide a readily dissociable source of oxygen which may increase the concentration of free cobalt atoms (Co) in the magnetic recording layer and also increase oxide content in the magnetic recording layer.

21 Claims, 11 Drawing Sheets

U.S. PATENT DOCUMENTS

| | | | |
|---|---|---|---|
| 2004/0185308 A1 | 9/2004 | Koda et al. | |
| 2005/0100764 A1 | 5/2005 | Ranjan et al. | |
| 2005/0202286 A1 | 9/2005 | Chen et al. | |
| 2005/0214520 A1 | 9/2005 | Oikawa et al. | |
| 2005/0214588 A1 | 9/2005 | Iwasaki et al. | |
| 2005/0255336 A1 | 11/2005 | Mukai | |
| 2006/0090998 A1 | 5/2006 | Honda et al. | |
| 2006/0199044 A1 | 9/2006 | Thangaraj et al. | |
| 2006/0204791 A1 | 9/2006 | Sakawaki et al. | |
| 2006/0286414 A1 | 12/2006 | Racine et al. | |
| 2006/0289294 A1* | 12/2006 | Racine et al. | 204/192.2 |
| 2007/0172706 A1 | 7/2007 | Chen | |
| 2007/0189916 A1 | 8/2007 | Zhang | |
| 2008/0206601 A1 | 8/2008 | Mukai | |
| 2009/0296278 A1 | 12/2009 | Inamura et al. | |
| 2010/0140727 A1 | 6/2010 | Shimatsu et al. | |
| 2010/0247962 A1 | 9/2010 | Sasaki | |

OTHER PUBLICATIONS

H. S. Jung et al., "CoCrPtO-Based Granular Composite Perpendicular Recording Media", IEEE Transactions on Magnetics, vol. 43, No. 6, pp. 2088-2090, Jun. 2007.

S. H. Park et al., "Effect of MgO and Al2O3 on the Microstructure and Magnetic Properties of CoCrPt-oxide Perpendicular Recording Media", Journal of Applied Physics, vol. 97, No. 10, pp. 106-1-3, 2005.

H. S. Jung et al., "Effect of Oxygen Incorporation on Microstructure and Media Performance in CoCrPt-SiO2 Perpendicular Recording Media", IEEE Transactions on Magnetics, vol. 43, No. 2, pp. 615-620, Feb. 2007.

G. Choe et al., "Magnetic and Recording Characteristics of Reactively Sputtered CoPtCr-(Si—O, Ti—O, and Cr—O) Perpendicular Media", IEEE Transactions on Magnetics, vol. 42, No. 10, pp. 2327-2329, Oct. 2006.

Thomas P. Nolan et al., "Microstructure and Exchange Coupling of Segregated Oxide Perpendicular Recording Media", IEEE Transactions on Magnetics, vol. 43, No. 2, pp. 639-644, Feb. 2007.

H. S. Jung et al., "Origin of Incoherent Magnetic Switching Behavior in CoCrPt—SiO2 Perpendicular Magnetic Recording Media", Applied Physics Letters, vol. 91, No. 212502, pp. 1-3, 2007.

M. Zheng et al., "Role of Oxygen Incorporation in Co—Cr—Pt—Si—O Perpendicular Magnetic Recording Media", IEEE Transactions on Magnetics, vol. 40, No. 4, pp. 2498-2500, Jul. 2004.

S. N. Piramanayagam et al., "Advanced Perpendicular Recording Media Structure With a Magnetic Intermediate Layer", Applied Physics Letters, vol. 88, No. 092501, pp. 1-3, 2006.

Gary C. Rauch et al., "The Effect of Cluster Size on Media Noise in Co—Ni—P Thin Films", IEEE Transactions on Magnetics, vol. 28, No. 5, pp. 3105-3107, Sep. 1992.

Atsushi Hashimoto et al., "Improvement of Magnetic Properties of Granular Perpendicular Recording Media by Using a FCC Nonmagnetic Intermediate Layer With Stacking Faults", Applied Physics Letters, vol. 89, No. 262508, pp. 1-3, 2006.

Atsushi Hashimoto et al., "Pseudo-HCP Nonmagnetic Intermediate Layer for Granular Media with High Perpendicular Magnetic Anisotropy", Journal of Physics D: Applied Physics, vol. 41, No. 012002, pp. 1-4, 2008.

K. W. Wierman et al., "RuxCr1-x/Ta Underlayer for Co-alloy Perpendicular Magnetic Recording", Journal of Applied Physics, vol. 91, No. 10, pp. 8031-8033, May 2002.

Hua Yuan et al., "Ru+Oxide Interlayer for Perpendicular Magnetic Recording Media", Journal of Applied Physics, vol. 103, 07F513, pp. 1-3, 2008.

Unoh Kwon et al., "Ru/Ru-Oxide Interlayers for CoCrPtO Perpendicular Recording Media", IEEE Transactions on Magnetics, vol. 41, No. 10, pp. 3193-3195, Oct. 2005.

Office Action in U.S. Appl. No. 12/242,210, filed Jun. 30, 2011.

Arnett, et al. "TMR and Squeeze at Gigabit Areal Densities", IEEE Transactions on Magnetics, V.28, No. 4, Jul. 1992, pp. 1984-1987.

H.S.Jung, et al. "Effect of Magnetic Softness in a Soft Layer on Media Properties of Hard/Soft Stacked Composite Perpendicular Media", Journal of Applied Physics 105, 07B740 (2009).

* cited by examiner

SPUTTERED COBALT OXIDE FOR PERPENDICULAR MAGNETIC RECORDING MEDIUM WITH LOW MEDIA NOISE

CROSS REFERENCE TO RELATED APPLICATIONS

This application claims the benefit of U.S. Provisional Application Ser. No. 61/083,506 filed Jul. 24, 2008, entitled SPUTTERED COBALT OXIDE FOR PERPENDICULAR MAGNETIC RECORDING MEDIUM WITH LOW MEDIA NOISE, the disclosure of which is incorporated herein by reference in its entirety for all purposes.

TECHNICAL FIELD

This invention relates to the field of disk drives and more specifically, to magnetic recording media used in disk drives.

BACKGROUND

Magnetic recording media has begun to incorporate perpendicular magnetic recording (PMR) technology in an effort to increase areal density and has recently demonstrated densities of 612 Gbits/in$^2$. Well-isolated smaller grains of higher magnetic anisotropy constant ($K_u$) can reduce media noise and improve thermal stability of a magnetic recording layer to achieve these higher areal densities. Enhanced grain isolation in a bottom magnetic recording layer of a PMR media structure, for example, can provide a smaller magnetic cluster size and narrow the size distribution. While microstructure can be improved by controlling oxide content in a recording layer (e.g., bottom magnetic recording layer), the oxide content is a complex function of oxide material of a sputtering target, amount of oxide material in the target, and degree of reactive sputtering with oxygen gas.

BRIEF DESCRIPTION OF THE DRAWINGS

The present invention is illustrated by way of example, and not limitation, in the figures of the accompanying drawings in which.

DETAILED DESCRIPTION

In the following description, numerous specific details are set forth such as examples of specific, components, processes, etc. to provide a thorough understanding of various embodiment of the present invention. It will be apparent, however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Embodiments of the present invention include a method of incorporating atomic oxygen into a magnetic recording layer by sputtering a target containing an oxide of cobalt. In one embodiment, the oxide of cobalt is sputtered to provide a readily dissociable source of oxygen which, upon oxygen dissociation, increases the concentration of free cobalt atoms (Co) in the magnetic recording layer and also increases an oxide content in the magnetic recording layer by preferred oxidation of existing elements (e.g. Cr). Incorporation of oxygen into a magnetic recording layer by sputtering an oxide of cobalt allows a desired oxide content to be achieved in the magnetic recording layer with a reduced amount of oxygen from gaseous sources (e.g., in reactive sputtering processes). Undesirable side effects of incorporating oxygen from gaseous sources may therefore be mitigated. For example, in a reactive sputtering process, a particular non-uniformity is associated with oxygen incorporation into a magnetic recording layer. This non-uniformity may be reduced by reducing a molecular oxygen ($O_2$) partial pressure during deposition. Oxide spitting and target arcing issues associated with targets having high oxide content may also be mitigated through application of embodiments of the present invention.

Figure 1:
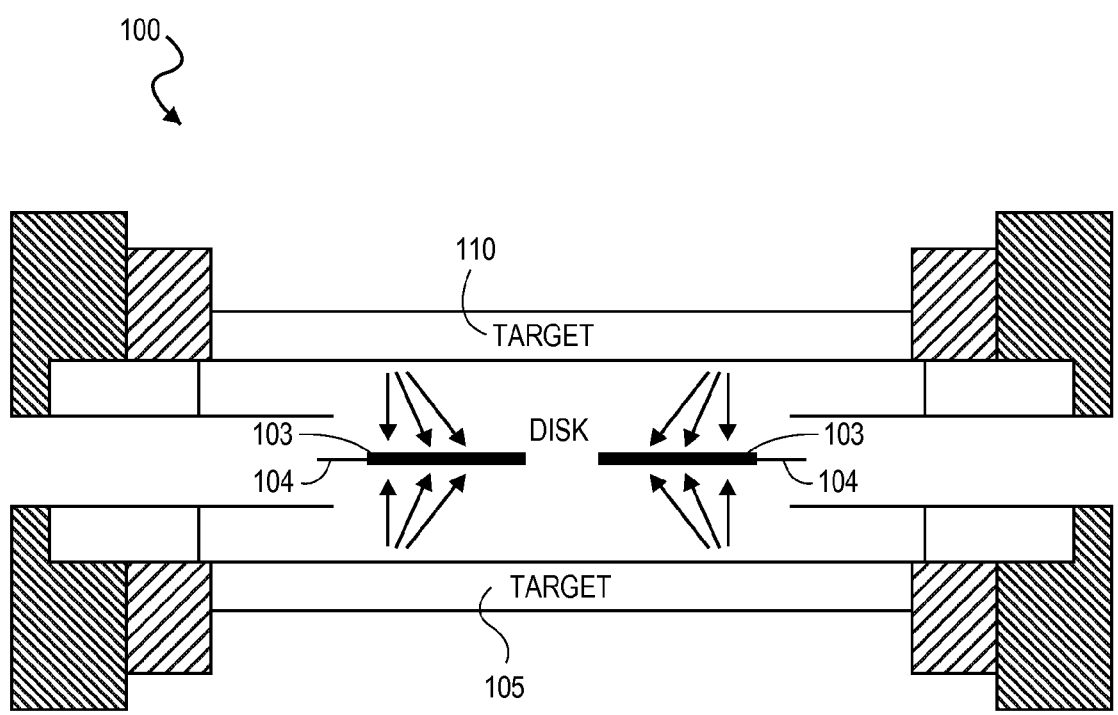
FIG. 1 illustrates a deposition system which may be employed in an embodiment of the present invention.

FIG. 1 illustrates a cross section of a DC magnetron sputter deposition chamber 100 which may be employed in an embodiment of the present invention. As depicted, the substrate 103 (e.g., disk) is positioned on a pallet 104 between two sputter targets 105 and 110 for simultaneous double-sided deposition. The first sputter target 105 and second sputter target 110, both of substantially the same composition, are proximate to a first and second side of the substrate 103. Of course, substrates may also be positioned for single-sided deposition as well.

In an embodiment, a sputter target (e.g., 105 and/or 110) includes a metal matrix. The metal matrix may include, but is not limited to, one or more of cobalt (Co), platinum (Pt), chromium (Cr) and boron (B). In one embodiment, a metal matrix includes CoCr—$Pt_yB_z$, where x is between 10 and 22, y is between 10 and 25 and Z is between 0 and 5.

In an embodiment, a sputter target includes a cobalt (Co) oxide. The Co oxide may include Co in any oxidation state, such as +1, +2 and +3. However, in a particularly advantageous embodiment the Co oxide is the divalent, Co(II) oxide (CoO). CoO has a Gibbs energy ($\Delta G_f$) of approximately $-214$ kJ/mol. While not bound by theory, with this relatively low Gibbs energy, a portion of oxygen atoms (O) from CoO may be expected to partially transfer into a metal matrix of the sputter target(s) 105 (and 110) and improve CoO particle adhesion with a metal matrix, providing less oxide spitting and target arcing issues and enabling a relatively higher CoO target concentration than non-cobalt oxides. A further portion of the oxygen atoms remaining as CoO particles may be expected to provide a readily dissociable source of oxygen in a sputtered layer.

In a further embodiment, a sputter target, such as 105 and/or 110, also includes one or more non-cobalt oxides. Generally, a non-cobalt oxide is any oxide which does not include Co. Exemplary non-cobalt oxides, include silicon dioxide ($SiO_2$), chromium oxides (e.g., chromium(III) oxide ($Cr_2O_3$)), titanium oxides (e.g., titanium(IV) oxide ($TiO_2$) or titanium(III) oxide ($Ti_2O_3$)), tantalum oxides (e.g., tantalum (V) oxide ($Ta_2O_5$)), niobium oxides (e.g., niobium(V) oxide ($Nb_2O_5$)), and tungsten oxides (e.g., tungsten(VI) oxide ($WO_3$) or tungsten(IV) oxide ($WO_2$)). Other non-cobalt oxides commonly employed in the art may similarly be employed. The exemplary non-cobalt oxides, having a Gibbs energy ($\Delta G_f$) of approximately $-750$ to $-1058$ kJ/mol, are relatively more thermodynamically stable than CoO. The relatively higher thermodynamic stability generally indicates that oxygen dissociation rates are lower, and these materials will therefore have relative lower diffusion into a metal matrix during preparation of the sputtering target(s) 105 (110). The relatively higher thermodynamic stability may also indicate adhesion of non-cobalt oxide particles in a metal matrix is limited relative to cobalt oxide and difficult to improve.

In certain embodiments, a metal matrix, a cobalt oxide and a non-cobalt oxide are all incorporated into a single target alloy. In such an alloy, the amount of atomic oxygen from all non-cobalt oxides in the target alloy is less than the total amount of atomic oxygen (O) in the target alloy because of the presence of CoO. The total amount of atomic oxygen may range from about 10 atomic percent (at. %) to about 25 at. % of the target alloy. In a particular embodiment, the total amount of atomic oxygen is between approximately 10 at. % and 20 at. % of the target alloy. In a further embodiment, all non-cobalt oxides provide approximately 20%-90% of the total amount of atomic oxygen. In other exemplary embodiments, the target alloy is CoCr—$Pt_yB_z$— (non-cobalt oxide)$_M$-(CoO)$_N$, where M is between 1 and 10 and N is between 1 and 15 and the non-cobalt oxide can be any of those described elsewhere herein.

Figure 2:
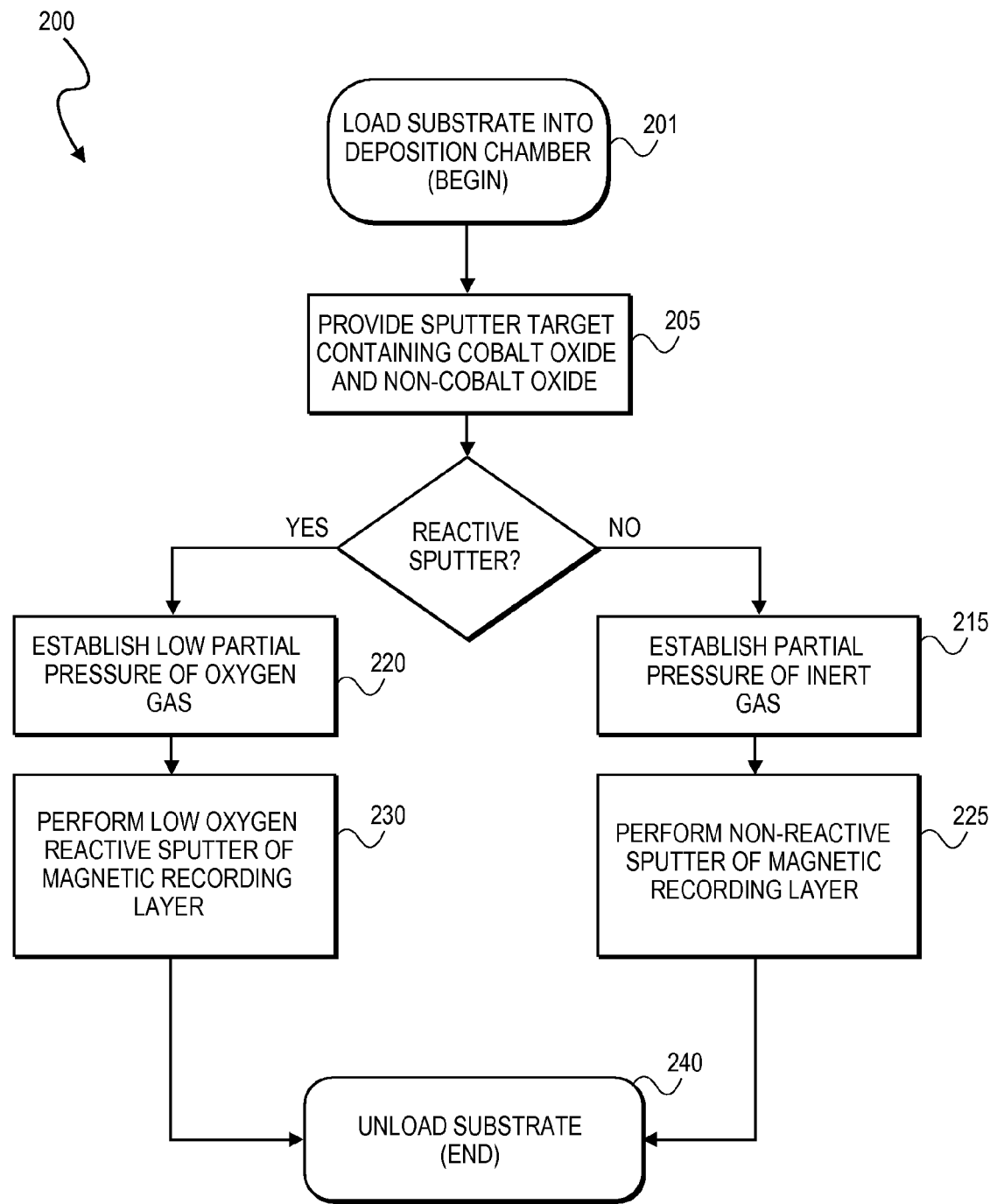
FIG. 2 illustrates a flow diagram of a method to form a layer in a magnetic media in accordance with an embodiment of the present invention.

Generally, the magnetic layer with compositions described herein may be formed by any deposition method known in the art. FIG. 2 illustrates a flow diagram of a sputter deposition method 200 to form a magnetic recording layer in a magnetic media in accordance with one embodiment of the present invention. Sputter deposition, also known as sputtering, is a technique for depositing thin films of a target material on a substrate such as, for example, a magnetic media substrate for a hard disk drive. In general, ions from a source gas plasma are accelerated toward the target composed of the material to be deposited. Free atoms of the target material are expelled when the ions collide with the target. A portion of the free atoms form a thin film on the surface of the substrate.

As shown in FIG. 2, the method begins at operation 201 with disposing a substrate in a chamber configured for sub-atmospheric plasma processing, such as a physical vapor deposition (PVD) chamber. A number of underlayers and intermediate layers may have previously been disposed on the substrate (e.g. as shown in the exemplary embodiment depicted in FIG. 3). Next, at operation 205, a sputter target containing a cobalt oxide (CoO) and a non-cobalt oxide is provided, such as sputter target 105 depicted in FIG. 1. In a first embodiment, at operation 215, at least an inert gas (e.g., Ar) is introduced into the process chamber and excited into an electrical plasma discharge within to provide a source of ions for sputtering the target. A magnetic field is formed to confine the plasma discharge and a bias potential is applied to the target to initiate non-reactive sputtering of target material at operation 225.

In an alternative embodiment, at operation 220, molecular oxygen ($O_2$) gas is introduced into the chamber to provide a reactive species. $O_2$ may be provided at a desired partial pressure by flowing an oxygen source gas diluted with an inert source gas (e.g. Ar). In particular embodiments, the $O_2$ partial pressure, during sputter deposition at operation 230, of a CoCrPt-(non-cobalt oxide+cobalt oxide) alloy target is greater than 0 mTorr (i.e. in the reactive sputtering regime) but less than 2.0 mTorr. In a preferred embodiment, the $O_2$ partial pressure during sputter deposition of a CoCrPt-(non-cobalt oxide+cobalt oxide) alloy target is between 0.1 mTorr and 1.5 mTorr.

It will be apparent to one of skill in the art that these $O_2$ partial pressures are significantly lower than those commonly employed in DC magnetron deposition of a magnetic recording layer when a CoCrPt target including only non-cobalt oxide is employed. As described in more detail elsewhere herein, these low partial pressures of $O_2$ nevertheless provide a high $H_c$ in the media previously available only when much higher $O_2$ partial pressures were employed. Because reactive deposition is employed to a lesser degree, control of $H_c$ becomes less sensitive to the sputtering process conditions during formation of the magnetic recording layer at operation 230. Furthermore, the additional oxygen provided by the cobalt oxide contained in the target has been found to oxidize Cr atoms in core grains of the magnetic recording layer. Relatively less Cr in the core grains may enhance $K_u$, and Cr—O formation may improve grain isolation. Grain isolation may be particularly improved at the bottom interface of the magnetic recording layer (i.e. portion of magnetic recording layer formed proximate to the underlayer).

In still other embodiments, the various constituents (e.g., metal matrix species, non-cobalt oxide and cobalt oxide) may be deposited on a substrate using a plurality of targets. Multi-target deposition methods are known in the art and generally consist of simultaneously sputtering separate targets or target portions, each of differing composition to form a mixture of the plurality of target compositions on a substrate.

Each target of a multi-target system may be in a separate sputter station and each sputter station may include either a DC magnetron source (for metal targets) or RF magnetron source (e.g. for oxide targets). Thus, while an exemplary embodiment includes a single sputter target of a CoCrPt- (non-cobalt oxide+cobalt oxide) alloy which is DC magnetron sputtered to form a magnetic recording layer on a substrate, one of ordinary skill in the art will appreciate a similar multi-target process may also be performed. For example, a CoCrPt target may be DC magnetron sputtered while a cobalt oxide target and a non-cobalt oxide target are RF magnetron sputtered to form the bottom magnetic recording layer.

The method of FIG. 2 may employ any deposition system known in the art to be capable of depositing the magnetic recording layer compositions with the methods described. In a particular embodiment where a magnetic layer is deposited with a sputtering process at least one of a DC magnetron sputter deposition or a RF sputter deposition chamber is employed. Once a magnetic recording layer is formed on a substrate by the method 200, the substrate may be unloaded at operation 240.

Figure 3:
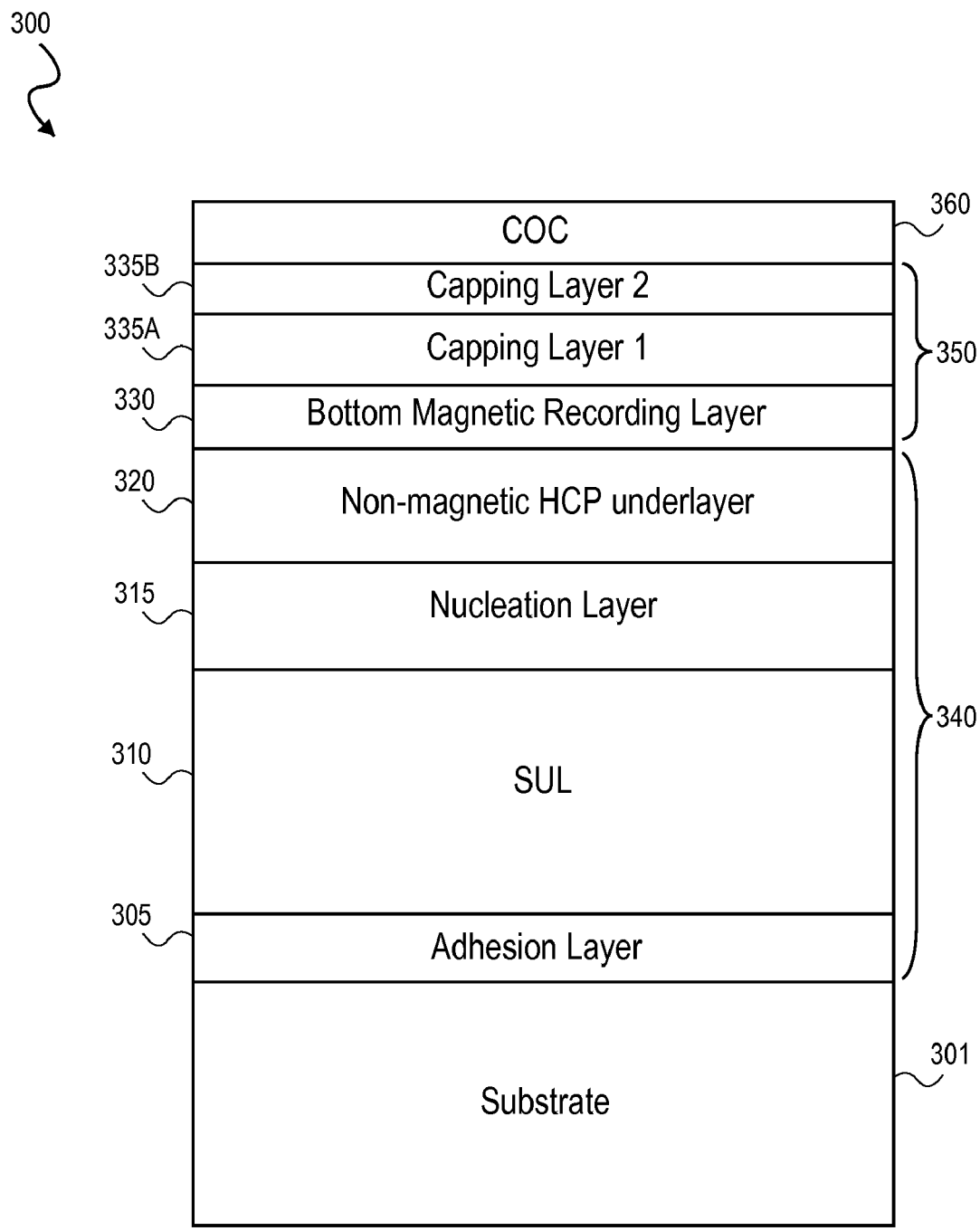
FIG. 3 illustrates a cross-sectional view of a perpendicular magnetic media structure in accordance with an embodiment.

FIG. 3 illustrates a cross-sectional view of an embodiment of a PMR media structure 300 including a magnetic recording layer containing a cobalt-oxide and non-cobalt oxide sputter deposited from a target alloy. Such a structure may have superior $H_c$ and $K_u$ and superior one or more of thermal stability, SNR and bit error rates (BER) relative to other magnetic layers. In one embodiment, a PMR media includes a substrate 301, a magnetic recording layer, an underlayer structure 340 disposed there between, and an overcoat 360. The above-mentioned layers (and the other layers discussed herein) may be formed on both sides of substrate to form a double-sided magnetic recording disk. However, only the layers on a single side of substrate are shown for ease of illustration. Alternatively, a single sided perpendicular magnetic recording disk may be formed.

The substrate 301 may be, for example, a glass material, a metal, and/or a metal alloy material. Glass substrates that may be used include, for example, a silica containing glass such as borosilicate glass and aluminosilicate glass. Metal and metal alloy substrates that may be used include, for example, aluminum (Al) and aluminum magnesium (AlMg) substrates, respectively. In an alternative embodiment, other substrate materials such as polymers and ceramics may be used. Substrate 301 may also be plated with a nickel phosphorous (NiP) layer (not shown). The substrate surface (or the plated NiP surface) may be polished and/or textured. A seed layer or adhesion layer 305 (e.g., Cr) may be disposed above the substrate. Substrates and seed layers are known in the art; accordingly, a more detailed discussion is not provided.

Disposed over the substrate and adhesion layer is a SUL 310. Generally, the SUL 310 may include any materials known in the art. In one exemplary embodiment the SUL 310 includes a synthetic antiferromagnet (SAF) structure comprising two soft ferromagnetic layers (e.g., CoTaZr or CoFeTaZr, etc.) antiferromagnetically coupled with one another across a spacer layer (e.g. ruthenium (Ru)) there-between.

As further depicted in FIG. 3, one or more additional layers may also be disposed between the SUL 310 and a bottom magnetic recording layer 330, for example, a nucleation layer 315 to facilitate a certain crystallographic growth within the magnetic recording layer 350. A structured nucleation layer in addition to the underlayer(s) may provide for a finer crystalline structure and a c-axis preferred orientation of the bottom magnetic recording layer 330. The underlayer structure 340 may include multiple non-magnetic intermediate layers 320. An underlayer, whether implemented as a nucleating underlayer or an intermediate layer, may control the morphology and grain orientation of subsequent layers. Specifically, a nucleation layer may control grain size, grain spacing, grain orientation and c-axis of the grains of subsequently deposited layers and of the bottom magnetic recording layer 330. For example, the nucleation layer 315 and intermediate layer 320 may be used to facilitate a crystal direction in the magnetic recording layer 350 that is perpendicular to the film plane. Exemplary intermediate layers include a Ru layer over NiW layer.

Disposed over the SUL 310 are one or more magnetic recording layers 350. The one or more magnetic recording layers 350 include at least a bottom magnetic recording layer 330 and, in a specific embodiment, include one or more capping layer 335 over the bottom magnetic recording layer 330. In one exemplary embodiment, where the method of FIG. 2 is applied, a CoCrPt-(oxide+CoO) magnetic recording layer is formed from a target containing at least CoO, the characteristics of which are discussed in more detailed elsewhere herein. In a preferred embodiment, both a non-cobalt oxide and a cobalt-oxide may be employed in the formation of a bottom magnetic recording layer 330. In further embodiments, a dual oxide target including both a non-cobalt oxide and a cobalt oxide may be employed in the formation of a first capping layer 335A over a bottom magnetic recording layer 330 and/or in the formation of a second capping layer 335B over the first capping layer 335A. In such embodiments, amounts of cobalt oxide of a capping layer may be reduced relative to those provided for a bottom magnetic recording layer.

Completing the magnetic media structure depicted in FIG. 3, one or more layers may be formed on top of the bottom magnetic layer(s). For example, an overcoat (OC) 360 may be used on top of the top magnetic recording layer to meet tribological requirements such as contact-start-stop (CSS) performance and corrosion protection. Predominant materials for the overcoat layer are carbon-based materials, such as hydrogenated or nitrogenated carbon (COC). A lubricant may be placed (e.g., by dip coating, spin coating, etc.) on top of the overcoat layer to further improve tribological performance. For example, the lubricant may be perfluoropolyether or phosphazene lubricant.

FIGS. 4 through 10 describe characteristics of media structures having different oxides (e.g., non-cobalt oxides only), different amounts of oxides (e.g., 10 at. %) and different sputter deposition conditions (e.g., $Ar/O_2$ mixture gas flow) employed in a bottom magnetic recording layer, such as the bottom magnetic recording layer 330 depicted in FIG. 3.

Figure 4:
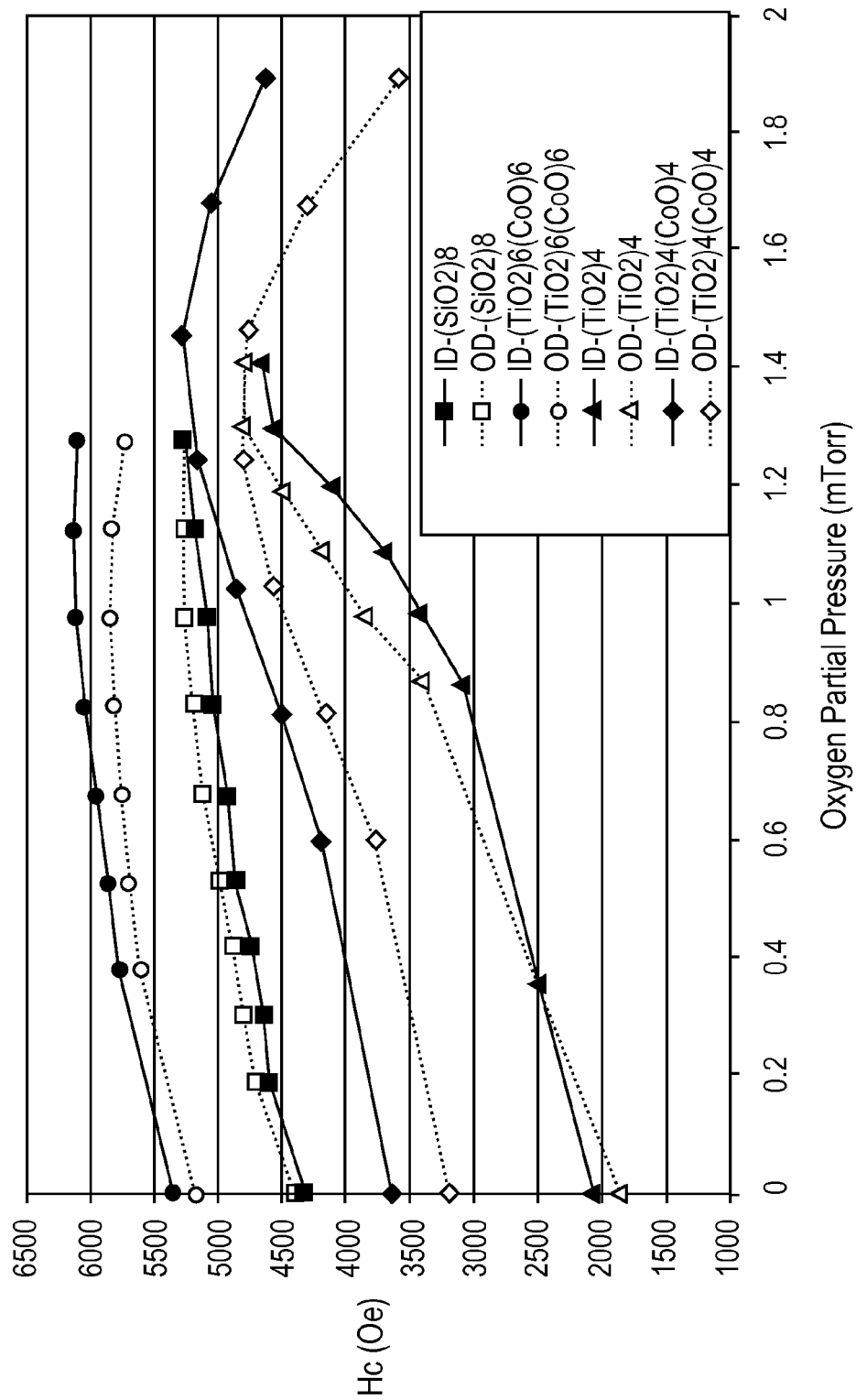
FIG. 4 illustrates coercivity $H_c$ over a range of oxygen partial pressures for a magnetic layer deposited with a target containing only non-cobalt oxide compared to a magnetic recording layer deposited by cobalt oxide containing targets in accordance with an embodiment of the present invention.

FIG. 4 illustrates $H_c$ over a range of oxygen partial pressures for a magnetic recording layer deposited with a target containing only non-cobalt oxide compared to a magnetic recording layer deposited from a cobalt oxide containing target. The effect on Hc of different oxide materials $(TiO_2)_4$, $(SiO_2)_8$, $(CoO)_4$—$(TiO_2)_4$ and $(CoO)_6$—$(TiO_2)_6$ is provided for a range of $O_2$ partial pressures. Two measurements are provided for each type of oxide, one taken at the inner substrate diameter (ID) and another taken at the outer substrate diameter (OD).

Figure 5:
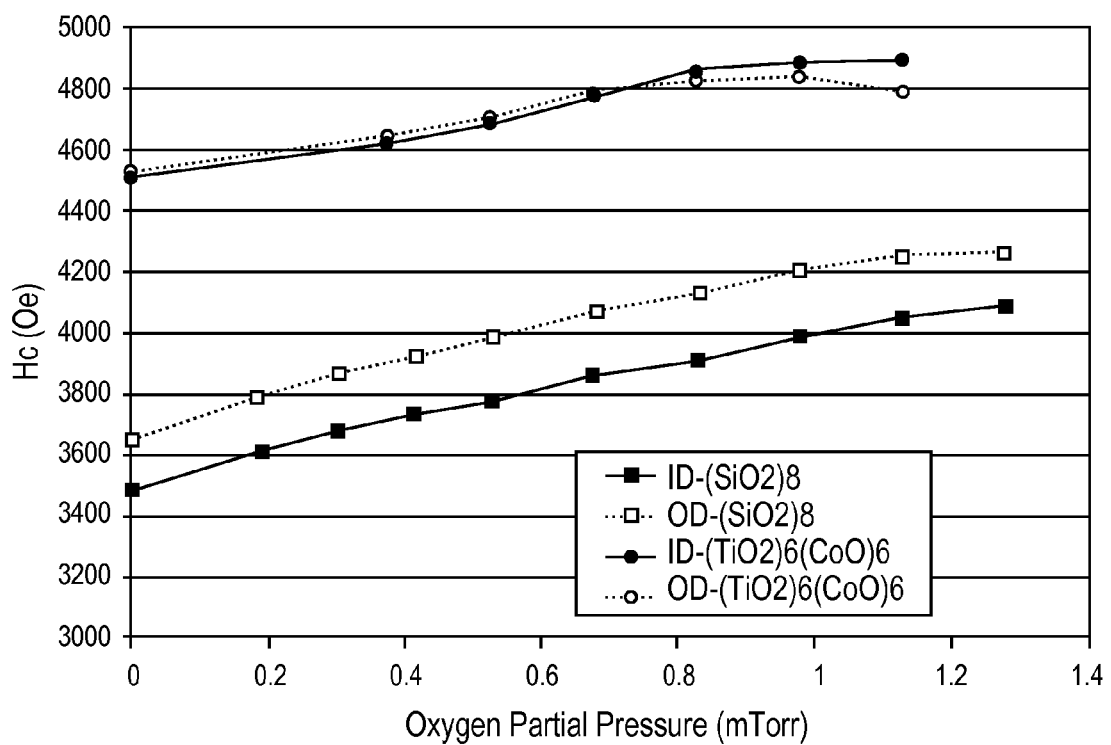
FIG. 5 illustrates $H_c$ over a range of oxygen partial pressures for targets having differing amounts of CoO, in accordance with embodiments.

FIG. 4 shows how the higher oxide content of the target alloy increases $H_c$, particularly at lower $O_2$ partial pressures. This illustrates how amounts of oxide in a target may significantly reduce the dependence of $H_c$ on reactive sputtering. For example, the magnetic recording layer formed with a dual $(CoO)_4$—$(TiO_2)_4$ target alloy displays higher Hc than a magnetic recording layer of equal thickness formed with a target alloy having a single $(TiO_2)_4$. FIG. 4 also depicts the lesser degree of reactive sputtering needed to achieve a particular $H_c$. For example, as shown in FIG. 5, an embodiment having a magnetic recording layer formed from a non-reactive sputtering of a CoCrPt—$(TiO_2)_6(CoO)_6$ alloy target has an $H_c$ approximately equal to the $H_c$ of a magnetic recording layer formed from CoCrPt—$(SiO_2)_8$ reactively sputtered with a $O_2$ partial pressure of approximately 1 mTorr. Finally, the magnetic recording layer formed from a target alloy containing $(CoO)_6$—$(TiO_2)_6$ combined with reactive sputter shows a Hc higher by 1kOe than the media formed from a target alloy containing only the non-cobalt oxide $(SiO_2)_8$.

FIG. 5 illustrates $H_c$ over a range of oxygen partial pressures for the magnetic media structure of FIG. 3 compared to a media structure including a magnetic layer deposited with a target containing only non-cobalt oxide. As shown, the improvement in $H_c$ in the bottom magnetic layer depicted in FIG. 4 remains in the full stack magnetic media structure.

Figure 6:
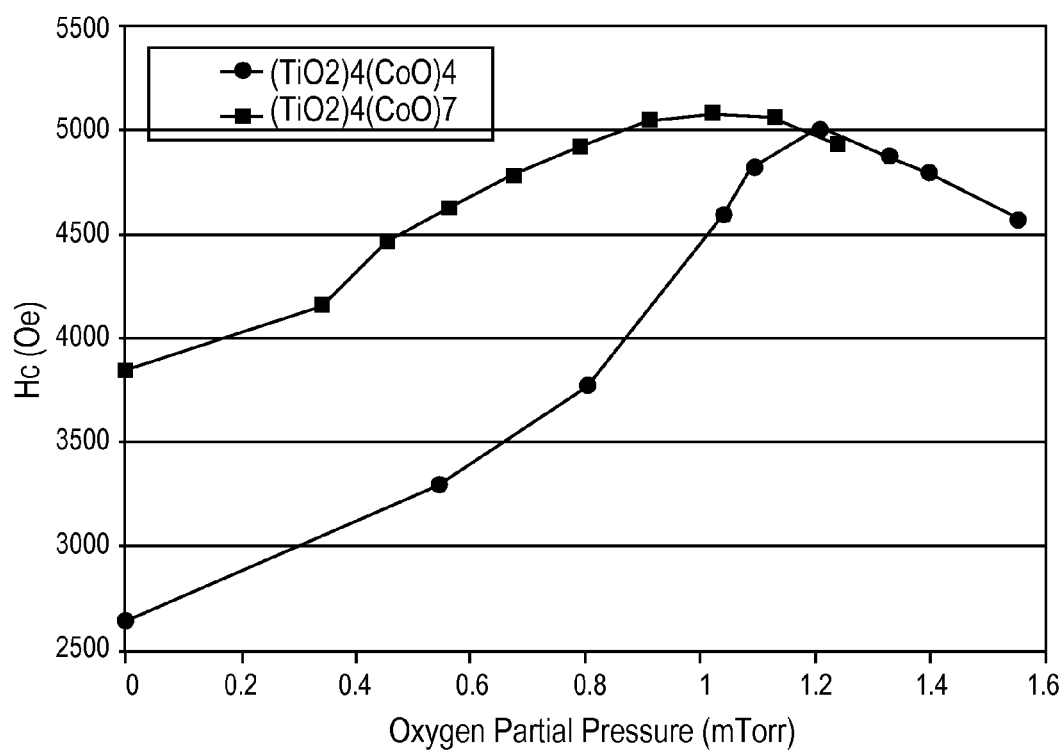
FIG. 6 illustrates $H_c$ over a range of oxygen partial pressures for the magnetic media structure of FIG. 3 with a bottom magnetic recording layer deposited with CoO—TiO$_2$ oxide containing targets having different amounts of CoO.

FIG. 6 illustrates $H_c$ for a magnetic recording layer formed from targets having differing amounts of CoO over a range of oxygen partial pressure, in accordance with embodiments of the present invention. As shown, the $H_c$ for the magnetic recording layer formed from a target with a dual oxide of $(TiO_2)_4(CoO)_7$ is both higher and less dependent on the oxygen partial pressure.

Figure 7:
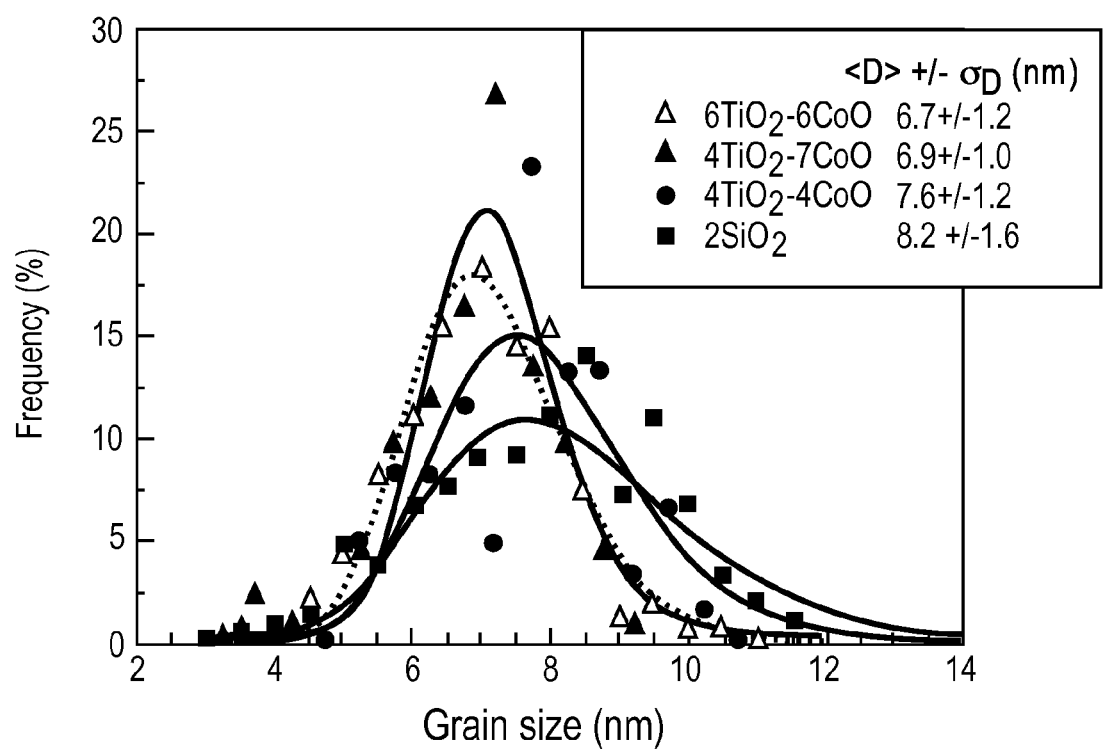
FIG. 7 illustrates a comparison of grain size distribution in various bottom magnetic recording layers.

FIG. 7 illustrates a comparison of grain size distribution in various bottom magnetic recording layers. For each of the different oxide contents, a reactive sputtering $O_2$ partial pressure was optimized to be approximately 1.4 mTorr for $(SiO_2)_2$, 1.2 mTorr for $(TiO_2)_4$—$(CoO)_4$, 0.7 mTorr for $(TiO_2)_4$—$(CoO)_7$, and 0.4 mTorr for $(TiO_2)_6$-$(CoO)_6$. The curves are fit by $\log_{normal}$ distribution. As shown, the mean grain size of 8.2 nm in the single oxide $(SiO_2)$ target is considerably larger than those of the dual oxide targets including both a non-cobalt oxide and a cobalt oxide (e.g. 6.7 nm for $(TiO_2)_6$-$(CoO)_6$). Furthermore, the grain size distribution has a greater spread (e.g. σ of 1.6 nm vs. 1.2 nm).

Figure 8A:
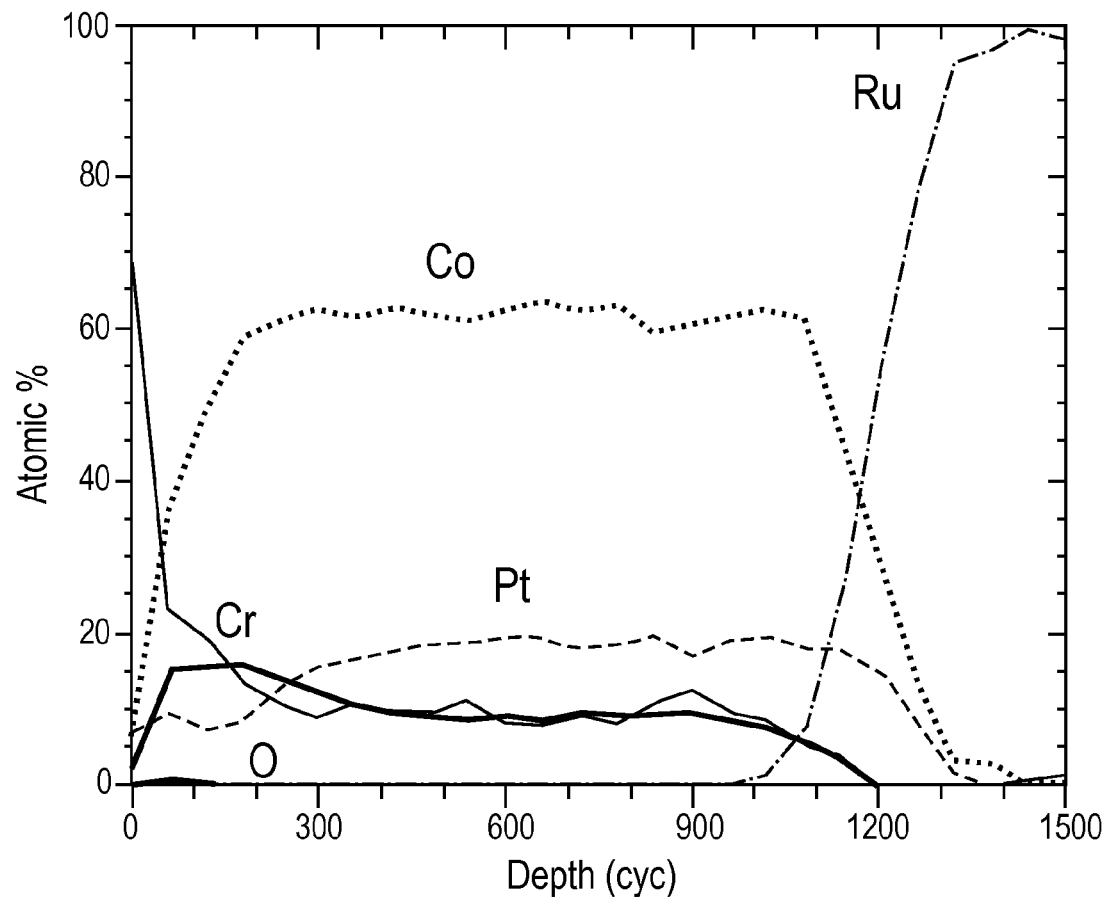
FIG. 8A illustrates an XPS depth profile in a media structure including a magnetic layer deposited with a target containing only non-cobalt oxide and a fixed oxygen partial pressure.

FIG. 8A illustrates an XPS depth profile in a media structure including a magnetic layer deposited from a target containing only non-cobalt oxide and a fixed oxygen partial pressure of approximately 0.8 mTorr. The Cr and 0 elements on top of a Ru interlayer move together, resulting in formation of a initial CoPt layer with relatively less isolation and therefore higher lateral intergranular exchange interactions ($A_{ex}$). A high $A_{ex}$ is known to enhance signal but increase transition noise, limiting areal density.

Figure 8B:
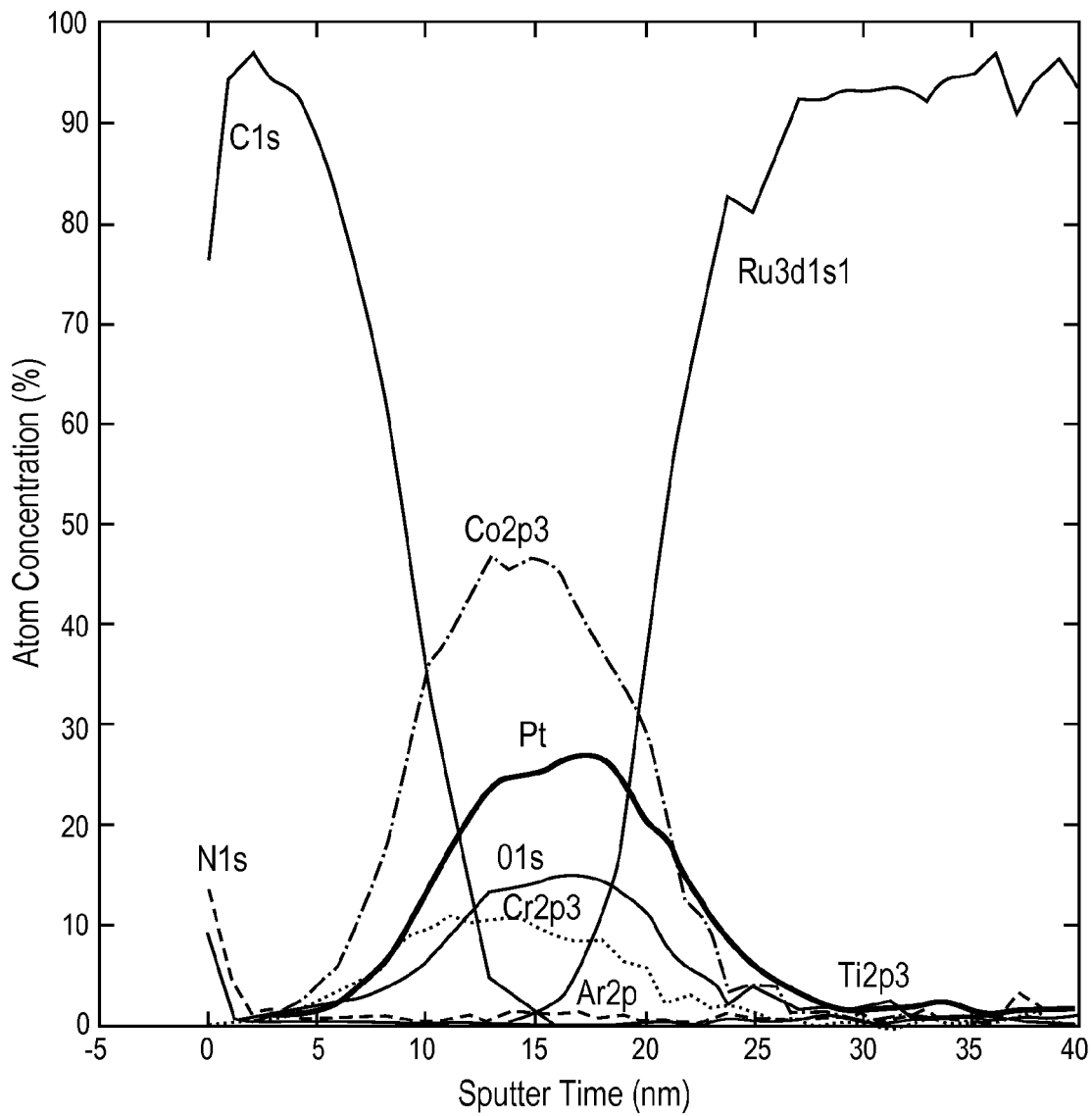
FIG. 8B illustrates an XPS depth profile in the magnetic media structure of FIG. 3 deposited with a same oxygen partial pressure as in FIG. 8A.

FIG. 8B illustrates an XPS depth profile in the magnetic media structure of FIG. 3 deposited with a same oxygen partial pressure as in FIG. 8A. In the depicted embodiment, the magnetic recording layer was formed from a target composition including $(CoO)_4$—$(TiO_2)_4$ providing both a non-cobalt oxide and a cobalt oxide. The 0 elemental peak in the magnetic recording layer changes with the Co and Pt at the interface of the Ru interlayer, indicating that grain isolation starts at the interface.

Figure 9:
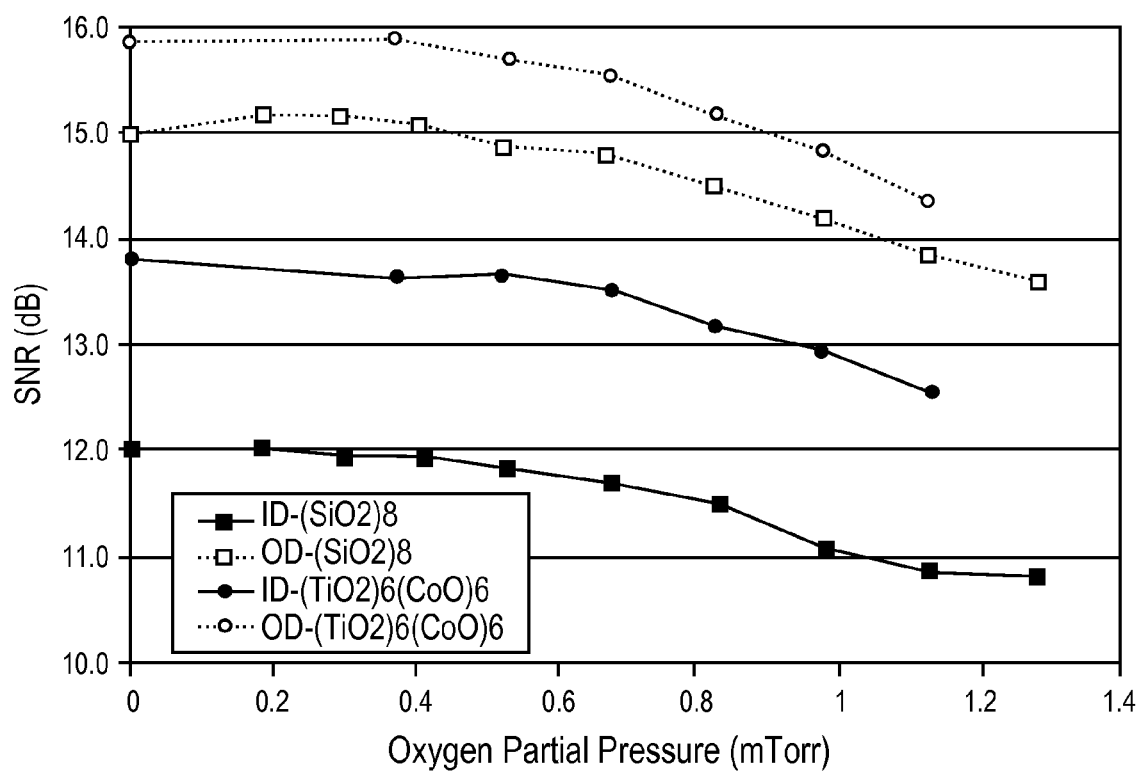
FIG. 9 illustrates a media signal-to-noise ratio (SNR) over a range of oxygen partial pressures for the magnetic media structure of FIG. 3 compared to that of a media structure including a magnetic recording layer deposited with a target containing only non-cobalt oxide.

FIG. 9 illustrates a media SNR over a range of oxygen partial pressures for the magnetic media structure of FIG. 3 compared to that of a media structure including a magnetic recording layer deposited with a target containing only non-cobalt oxide. As depicted, the SNR for the full stack magnetic media structure having a magnetic recording layer formed from the dual oxide (non-cobalt oxide+cobalt oxide) target has more than a 1 dB improvement at the substrate ID for both reactive and non-reactive sputtering conditions. The disparity in SNR between the substrate ID and OD is also reduced for the dual oxide condition for both reactive and non-reactive sputtering conditions. The improvement of SNR may be attributed to a reduction of transition noise related to the improved isolation proximate to the interface of the underlying interlayer depicted in FIG. 8B.

Figure 10:
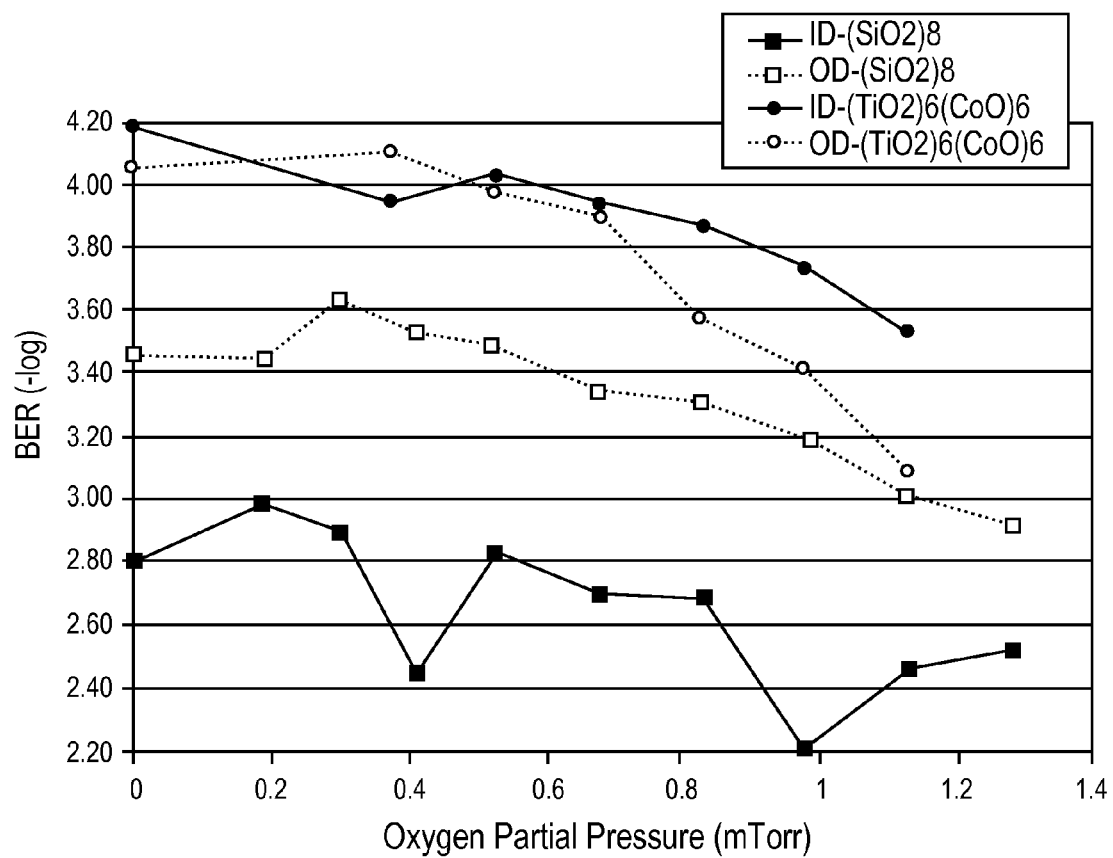
FIG. 10 illustrates a media bit error rate (BER) over a range of oxygen partial pressures for the magnetic media structure of FIG. 3 compared to that of a media structure including a magnetic recording layer deposited with a target containing only non-cobalt oxide.

FIG. 10 illustrates a media bit error rate (BER) over a range of oxygen partial pressures for the magnetic media structure of FIG. 3 compared to that of a media structure including a magnetic recording layer deposited with a target containing only non-cobalt oxide. As depicted, media with $(CoO)_6$—$(TiO_2)_6$ exhibit higher BER by 0.6-1.0 order than the media with $(SiO_2)_8$ single oxide. The superior BER is likely attributable to improved SNR and media writeability because the two media displayed very similar reversal overwrite (OW2).

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A method of forming a magnetic recording media, the method comprising:
providing a substrate; and
sputtering a target alloy including at least cobalt(Co), chromium (Cr), platinum(Pt), cobalt (II) oxide (CoO), and one or more non-cobalt oxides to form a magnetic recording layer over the substrate.

2. The method as in claim 1, wherein the Gibbs energy ($\Delta G_f$) of the one or more non-cobalt oxides is at least three times that of CoO.

3. The method as in claim 2, wherein at least one of the one or more non-cobalt oxides is selected from the group consisting of: silicon dioxide, chromium oxides, titanium oxides, tantalum oxides, niobium oxides, and tungsten oxides.

4. The method of claim 3, wherein at least one of the one or more non-cobalt oxides is selected from the group consisting of: silicon dioxide $(SiO_2)$, titanium(IV) oxide $(TiO_2)$.

5. The method as in claim 1, wherein the target alloy includes a total amount of atomic oxygen between approximately 12 at. % and 25 at. % and the atomic oxygen from all non-cobalt oxides is approximately 20%-90% of the total amount of atomic oxygen.

6. The method as in claim 1, wherein the target alloy further includes an amount of cobalt (Co) greater than the amount of cobalt present in the CoO.

7. The method as in claim 6, wherein the target alloy further comprises a concentration of chromium (Cr) and platinum (Pt) to form a $(Co_xCr_yPt_{1-(x+y)})$ metal alloy matrix doped with the one or more non-cobalt oxides and the CoO.

8. The method as in claim 1, wherein a non-magnetic underlayer and a soft magnetic underlayer (SUL) is formed over the substrate prior to forming the magnetic recording layer of a perpendicular recording media (PMR).

9. The method as in claim 1, wherein sputtering the target alloy further comprises:
providing, in a physical vapor deposition (PVD) chamber, a partial pressure of molecular oxygen $(O_2)$ no greater than 2 mTorr to reactively sputter the target.

10. The method as in claim 9, wherein the partial pressure of $O_2$ is 0.5 mTorr to 1.5 mTorr.

11. The method as in claim 1, wherein sputtering the target alloy further comprises:
providing, in a physical vapor deposition (PVD) chamber, a negligible partial pressure of molecular oxygen $(O_2)$ to non-reactively sputter the target.

12. The method of claim 1, further comprising:
sputtering a second target alloy including a CoO and one or more non-cobalt oxides to form a capping layer over the magnetic recording layer, where the amount of CoO the second target alloy is less than that in the target alloy sputtered to form the magnetic recording layer.

13. The method of claim 1, wherein the chromium (Cr) and platinum (Pt) form a $CoCr_xPt_yB_z$ metal matrix, wherein x is between 10 and 22, y is between 10 and 25, and z is between 0 and 5.

14. The method of claim 13, wherein the target alloy is $CoCr_xPt_yB_z$-(non-cobalt oxide)$_M$-(CoO)$_N$, wherein M is between 1 and 10 and N is between 1 and 15.

15. The method of claim 14, wherein the non-cobalt oxide is selected from the group consisting of: silicon dioxide ($SiO_2$), chromium(III) oxide ($Cr_2O_3$), titanium(IV) oxide ($TiO_2$), tantalum(V) oxide ($Ta_2O_5$), niobium(V) oxide ($Nb_2O_5$) and tungsten(II) oxide ($WO_3$).

16. The method of claim 15, wherein the one or more non-cobalt oxide is $TiO_2$ with the (non-cobalt oxide)$_M$-(CoO)$_N$ being one of: $(TiO_2)_6(CoO)_6$, $CoCrPt-(TiO_2)_4(CoO)_7$, or $CoCrPt-(TiO_2)_4(CoO)_4$.

17. A deposition system for depositing a magnetic recording layer over a magnetic recording media, comprising:
  a first target comprising an alloy including cobalt (CO), chromium (Cr), platinum (Pt), cobalt (II) oxide (CoO), and one or more non-cobalt oxides; and
  a pallet to position a first recording media substrate surface proximate to the first target, wherein the first substrate includes a magnetic layer.

18. The deposition system as in claim 17, further comprising:
  a second target of substantially the same alloy composition as the first target positioned proximate to a second substrate surface.

19. The deposition system as in claim 17, wherein the Gibbs energy ($\Delta G_f$) of the one or more non-cobalt oxides is at least three times that of CoO.

20. The deposition system as in claim 17, wherein the target alloy further includes an amount of cobalt (Co) greater than the amount of cobalt present in the CoO.

21. The deposition system as in claim 20, wherein the target alloy further comprises a concentration of chromium (Cr) and platinum (Pt) to form a $(Co_xCr_yPt_{1-(x+y)})$ metal alloy matrix doped with non-cobalt oxide and CoO.

* * * * *